US010084487B2

(12) United States Patent
Jin et al.

(10) Patent No.: US 10,084,487 B2
(45) Date of Patent: Sep. 25, 2018

(54) APPARATUSES AND METHODS FOR ERASURE-ASSISTED ECC DECODING

(71) Applicant: Micron Technology, Inc., Boise, ID (US)

(72) Inventors: Ming Jin, Fremont, CA (US); Dennis P. O'Connor, Granite Bay, CA (US)

(73) Assignee: Micron Technology, Inc., Boise, ID (US)

( * ) Notice: Subject to any disclaimer, the term of this patent is extended or adjusted under 35 U.S.C. 154(b) by 4 days.

(21) Appl. No.: 15/193,965

(22) Filed: Jun. 27, 2016

(65) Prior Publication Data
US 2017/0373705 A1    Dec. 28, 2017

(51) Int. Cl.
| | |
|---|---|
| *H03M 13/00* | (2006.01) |
| *H03M 13/37* | (2006.01) |
| *G06F 11/10* | (2006.01) |
| *G11C 29/52* | (2006.01) |
| *G11C 29/04* | (2006.01) |

(52) U.S. Cl.
CPC ..... *H03M 13/3746* (2013.01); *G06F 11/1068* (2013.01); *G11C 29/52* (2013.01); *H03M 13/3738* (2013.01); *G11C 2029/0409* (2013.01); *G11C 2029/0411* (2013.01)

(58) Field of Classification Search
CPC .......... H03M 13/3746; H03M 13/3738; G06F 11/1068; G11C 29/52
See application file for complete search history.

(56) References Cited

U.S. PATENT DOCUMENTS

| | | | | |
|---|---|---|---|---|
| 7,171,594 B2* | 1/2007 | Wyatt | ................. | G06F 11/0727 714/704 |
| 7,197,692 B2* | 3/2007 | Sutivong | ............... | H04L 1/0045 375/262 |
| 7,231,578 B2* | 6/2007 | Hassner | ................. | G11B 20/18 714/762 |
| 7,610,544 B2* | 10/2009 | Guo | ...................... | H04L 1/0052 714/776 |
| 7,698,619 B1* | 4/2010 | Liu | ..................... | H03M 13/154 714/752 |

(Continued)

OTHER PUBLICATIONS

Blaum, et al. "Partial-MDS Codes and Their Application to RAID Type of Architectures", IEEE Transactions on Information Theory, vol. 59, No. 7, Jul. 2013, pp. 4510-4519.

(Continued)

*Primary Examiner* — Esaw T Abraham
(74) *Attorney, Agent, or Firm* — Brooks, Cameron & Huebsch, PLLC

(57) ABSTRACT

One example of erasure-assisted error correction code (ECC) decoding can include reading a codeword with a first trim level, reading the codeword with a second trim level, and reading the codeword with a third trim level. A first result from reading the codeword with the first trim level, a second result from reading the codeword with the second trim level, and a third result from reading the codeword with the third trim level can be accumulated. An erasure of a detected unit sequence can be computed. The detected unit sequence can be modified by changing a unit in a position of the detected unit sequence corresponding to a position of the erasure. The modified detected unit sequence can be ECC decoded.

21 Claims, 6 Drawing Sheets

(56) References Cited

U.S. PATENT DOCUMENTS

| | | | | |
|---|---|---|---|---|
| 8,718,189 | B2* | 5/2014 | Limberg | H04L 1/0071 |
| | | | | 375/298 |
| 8,938,665 | B2* | 1/2015 | Mittelholzer | G06F 11/1004 |
| | | | | 714/807 |
| 9,202,580 | B2* | 12/2015 | Mittelholzer | G11C 16/26 |
| 9,305,639 | B2* | 4/2016 | Mittelholzer | G11C 11/5642 |
| 9,477,540 | B2* | 10/2016 | Antonakopoulos | G06F 11/073 |

OTHER PUBLICATIONS

Abdel-Ghaffar, et al. "Multilevel Error-Control Codes for Data Storage Channels", IEEE Transactions on Information Theory, vol. 37, No. 3, May 1991, pp. 735-741.

Hassner, et al. "Integrated Interleaving—A Novel ECC Architecture", IEEE Transactions on Magnetics, vol. 37, No. 2, Mar. 2001, pp. 773-775.

Tang, et al. "A Novel Method for Combining Algebraic Decoding and Iterative Processing", IEEE International Symposium on Information Theory, Seattle, WA, USA, Jul. 2006, pp. 474-478.

Blaum, et al. "Generalized Concatenated Types of Codes for Erasure Correction", <http://arxiv.org/abs/1406.6270>, San Jose, CA, USA, Jul. 10, 2014, 28 pp.

Tang, et al. "On the Performance of Integrated Interleaving Coding Schemes", IEEE International Symposium on the Information Theory, Chicago, IL, USA, 2002, pp. 267-271.

Maucher, et al. "On the Equivalence of Generalized Concatenated Codes and Generalized Error Location Codes", IEEE Transaction on Information Theory, vol. 46, No. 2, Mar. 2000, pp. 642-649.

Mceliece, et al. "On the Decoder Error Probability for Reed-Solomon Codes". IEEE Transactions on Information Theory, vol. 32, No. 5, Sep. 1986, pp. 701-703.

Wu "New List Decoding Algorithms for Reed-Solomon and BCH Codes", IEEE Transactions on the Information Theory, vol. 54, No. 8, Aug. 2008, 3611-3630.

\* cited by examiner

| BIT | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|
| TRIM LEVEL 1 | 1 | 1 | 1 | 0 | 0 | 1 | 1 | 1 | 0 | 0 | 0 | 0 | 0 | 1 | 1 | 0 | 1 |
| TRIM LEVEL 2 | 1 | 1 | 1 | 0 | 0 | 1 | 1 | 1 | 0 | 0 | 0 | 1 | 0 | 1 | 1 | 0 | 1 |
| TRIM LEVEL 3 | 1 | 1 | 1 | 0 | 0 | 1 | 0 | 1 | 0 | 1 | 0 | 1 | 0 | 1 | 1 | 0 | 1 |
| TRIM LEVEL 4 | 1 | 1 | 1 | 0 | 1 | 1 | 0 | 1 | 0 | 1 | 0 | 1 | 0 | 1 | 1 | 0 | 1 |
| TRIM LEVEL 5 | 1 | 1 | 1 | 0 | 1 | 1 | 0 | 1 | 1 | 1 | 1 | 1 | 0 | 1 | 1 | 0 | 1 |
| TRIM LEVEL 6 | 1 | 1 | 1 | 0 | 1 | 1 | 0 | 1 | 1 | 1 | 1 | 1 | 0 | 1 | 1 | 0 | 1 |
| TRIM LEVEL 7 | 1 | 1 | 1 | 0 | 1 | 1 | 0 | 1 | 1 | 1 | 1 | 1 | 0 | 1 | 1 | 0 | 1 |
| TRIM LEVEL 8 | 1 | 1 | 1 | 0 | 1 | 1 | 0 | 1 | 1 | 1 | 1 | 0 | 0 | 1 | 1 | 0 | 1 |
| TRIM LEVEL 9 | 1 | 1 | 1 | 0 | 1 | 1 | 0 | 1 | 1 | 1 | 1 | 1 | 0 | 1 | 1 | 0 | 0 |
| TRIM LEVEL 10 | 1 | 1 | 1 | 0 | 1 | 1 | 0 | 1 | 1 | 1 | 1 | 1 | 0 | 1 | 1 | 0 | 0 |
| SUM | 10 | 10 | 10 | 0 | 7 | 10 | 2 | 10 | 5 | 8 | 6 | 8 | 0 | 10 | 10 | 0 | 9 |
| DETECTED BIT | 1 | 1 | 1 | 0 | 1 | 1 | 0 | 1 | 0 | 1 | 1 | 1 | 0 | 1 | 1 | 0 | 1 |
| RELIABILITY VALUE | 5 | 5 | 5 | 5 | 2 | 5 | 3 | 5 | 0 | 3 | 1 | 3 | 5 | 5 | 5 | 5 | 4 |

*Fig. 5*

APPARATUSES AND METHODS FOR ERASURE-ASSISTED ECC DECODING

TECHNICAL FIELD

The present disclosure relates generally to semiconductor memory apparatuses and methods, and more particularly, erasure-assisted ECC decoding.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can retain stored data when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory (e.g., NAND flash memory and/or NOR flash memory), and/or can include volatile memory (e.g., DRAM and/or SRAM), among various other types of non-volatile and volatile memory. Flash memory devices can include memory cells storing data in a charge storage structure such as a floating gate, for instance, and may be utilized as non-volatile memory for a wide range of electronic applications. Flash memory devices typically use a one-transistor memory cell that allows for high memory densities, high reliability, and low power consumption, relative to various other memory devices.

Memory cells in an array architecture can be programmed to a target (e.g., desired) state. For instance, electric charge can be placed on or removed from the charge storage structure (e.g., floating gate) of a memory cell to program the cell to a particular data state. The stored charge on the charge storage structure of the memory cell can indicate a threshold voltage (Vt) of the cell.

For example, a single level cell (SLC) can be programmed to a targeted one of two different data states, which can be represented by the binary units 1 or 0. Some flash memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one unit (e.g., more than one bit).

A state of a flash memory cell can be determined by sensing the stored charge on the charge storage structure (e.g., the Vt) of the cell. However, a number of mechanisms, such as read disturb, program disturb, cell-to-cell interference, and/or charge loss (e.g., charge leakage), for example, can cause the Vt of the memory cell to change. Error correction code (ECC) schemes such as, a low-density parity-check (LDPC), Bose-Chaudhuri-Hocquenghen (BCH) and Reed-Solomon (RS) have been used to correct those errors; however, such ECC schemes typically have a limited error correction capability. For instance, various ECC schemes are incapable of error correction beyond a threshold bit error rate (BER). As such, an increase in the quantity of bit errors associated with a particular amount of data can result in the BER exceeding the capability of the ECC scheme, resulting in an uncorrectable ECC error, which can lead to loss of data, for instance.

BRIEF DESCRIPTION OF THE DRAWINGS

FIG. 5 is an example of accumulations and reliability value computations in accordance with a number of embodiments of the present disclosure.

DETAILED DESCRIPTION

Figure 1:
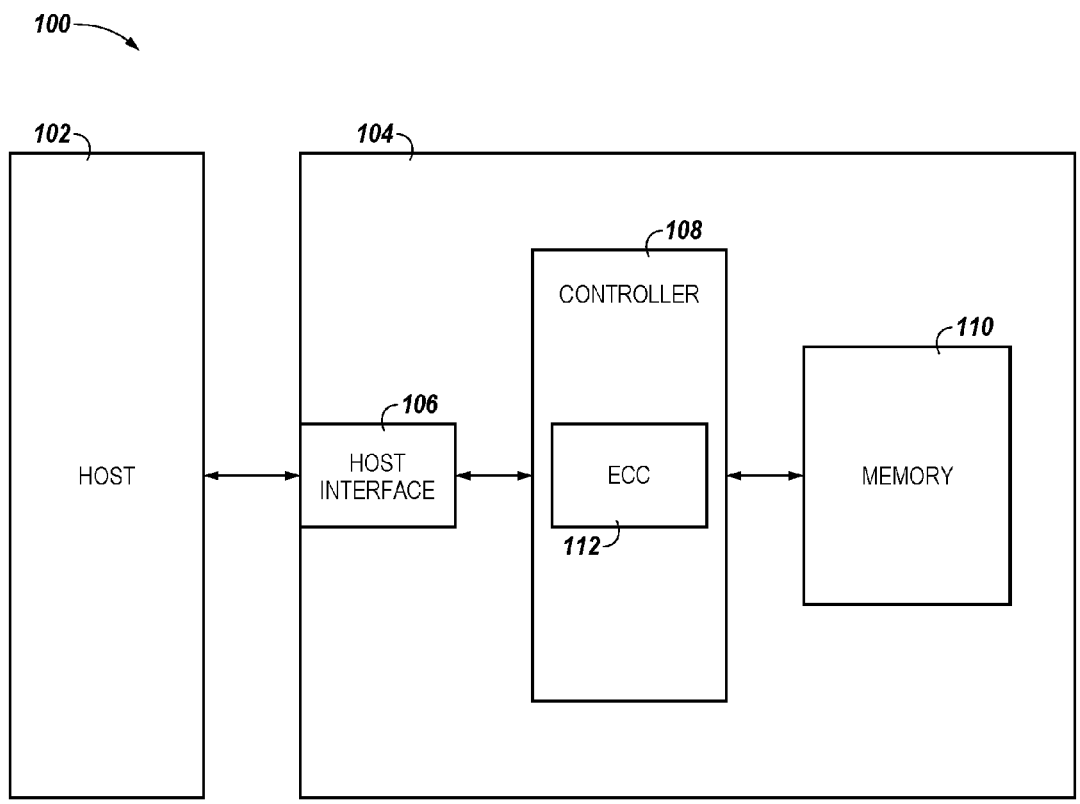
FIG. 1 is a block diagram of an apparatus in the form of a computing system including a memory system capable of erasure-assisted ECC decoding in accordance with a number of embodiments of the present disclosure.

The present disclosure includes apparatuses and methods for erasure-assisted error decoding. An example method comprises reading a codeword with a first trim level, reading the codeword with a second trim level, reading the codeword with a third trim level. A first result from reading the codeword with the first trim level, a second result from reading the codeword with the second trim level, and a third result from reading the codeword with the third trim level can be accumulated. An erasure of the accumulation can be computed. A unit of the codeword can be changed (e.g., flipped), wherein the unit is in a position of the third result corresponding to a position of the erasure in the accumulation. The third result having the unit changed can be ECC decoded.

Embodiments of the present disclosure can provide benefits such as improving the performance of an ECC decoding retry process following an ECC decoding failure. In some approaches, an ECC decoding retry process may include changing a first trim level to yield a second trim level with which a codeword is read. For example, after an ECC decoding failure with a default trim level, the trim level may be changed from a previous trim level by incrementing or decrementing the trim level or by adding a trim level step to or subtracting a trim level step from a previous trim level and then the ECC decoding may be tried again. If there is another ECC decoding failure, the trim level may be changed again up to a particular number of iterations. Even after all of the iterations of changing the trim level the ECC decoding may still fail.

In a number of embodiments in accordance with the present disclosure, additional steps can be taken to improve the performance of an ECC decoding retry process. A result from reading a codeword from a current iteration can be accumulated with one or more previous results from reading the codeword from one or more previous iterations. The result from reading the codeword from the current iteration can be compared to the previous results from reading the codeword from previous iterations to determine if a value of a unit of the result from the current iteration has changed (e.g., from "0" to "1") in relation to the previous results from reading the codeword from previous iterations. By using this soft information, one or more erasures (e.g., "unreliable" units) in the codeword can be determined. As used herein, an "erasure" is meant to refer to a unit of a second result from reading the codeword with a second trim level (before ECC decoding) that may be different than a corresponding unit in a first result from reading the codeword with a first trim level.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "M" and "N", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory system 104 capable of erasure-assisted ECC decoding (for example as described with respect to FIGS. 3A-4) in accordance with a number of embodiments of the present disclosure.

As used herein, a memory system 104, a controller 108, or a memory device 110 might also be separately considered an "apparatus." The memory system 104 can be a solid state drive (SSD), for instance, and can include a host interface 106, a controller 108 (e.g., a sequencer and/or other control circuitry), and a number of memory devices 110, which can be referred to as the memory 110. The memory 110 can be a hybrid memory cube (HMC), processing in memory random access memory (PIMRAM) array, DRAM array, SRAM array, STT RAM array, PCRAM array, TRAM array, RRAM array, NAND flash array, and/or NOR flash array, for instance. The memory 110 can provide a storage volume for the memory system 104.

The controller 108 can be coupled to the host interface 106 and to the memory 110 via a plurality of channels (not shown) and can be used to transfer data between the memory system 104 and a host 102. The host interface 106 can be in the form of a standardized interface. For example, when the memory system 104 is used for data storage in a computing system 100, the host interface 106 can be a serial advanced technology attachment (SATA), peripheral component interconnect express (PCIe), or a universal serial bus (USB), among other connectors and interfaces. In general, however, the host interface 106 can provide an interface for passing control, address, data, and other signals between the memory system 104 and a host 102 having compatible receptors for the host interface 106.

The host 102 can be a host system such as a personal laptop computer, a desktop computer, a digital camera, a mobile telephone, or a memory card reader, among various other types of hosts. The host 102 can include a system motherboard and/or backplane and can include a number of memory access devices (e.g., a number of processors). The host 102 can also be a memory controller, such as where the memory system 104 is a memory device (e.g., a memory device having an on-die controller).

The controller 108 can communicate with the memory 110 (which in some embodiments can be a number of memory arrays on a single die) to control data read, write, and erase operations, among other operations. As an example, the controller 108 can be on a same die or a different die than a die or dice corresponding to memory 110.

Although not specifically illustrated, the controller 108 can include a discrete memory channel controller for each channel coupling the controller 108 to the memory 110. The controller 108 can include, for example, a number of components in the form of hardware and/or firmware (e.g., one or more integrated circuits) and/or software for controlling access to the memory 110 and/or for facilitating data transfer between the host 102 and the memory 110.

As illustrated in FIG. 1, the controller 108 can include an ECC component 112 (shown as "ECC"). The ECC component 112 can decode a codeword. A codeword can have a total size that includes a wrapper and a payload. The codeword payload can refer to the data (e.g., user data) that is encoded within the codeword. The codeword wrapper can refer to the error data that is encoded in the codeword along with the payload to protect the payload. The ECC component 112 can include, for example, an algebraic error correction circuit such as one of the group including a Bose-Chaudhuri-Hocquenghem (BCH) error correction circuit and a Reed-Solomon error correction circuit, among other types of error correction circuits. The ECC component 112 is not limited to circuitry (e.g., hardware) implementations. For instance, the ECC component 112 can be implemented in hardware, firmware, and/or software. Also, the ECC component 112 is not limited to a particular type of error correction scheme. For example, the ECC component 112 can be an LDPC component, among various other types of ECC components. Although referred to as an ECC component, the ECC component 112 can be used to detect, as well as to correct, data errors. Additionally, the ECC component 112 can include encoding and decoding functionality as described further below.

The ECC component 112 can be discrete components such as an application specific integrated circuit (ASIC) or the components may reflect functionally provided by circuitry within the controller 108 that does not necessarily have a discrete physical form separate from other portions of the controller 108. Although illustrated as components within the controller 108 in FIG. 1, the ECC component 112 can be external to the controller 108 or can have a number of components located within the controller 108 and a number of components located external to the controller 108.

The memory 110 can include a number of arrays of memory cells (e.g., non-volatile memory cells). The arrays can be flash arrays with a NAND architecture, for example. However, embodiments are not limited to a particular type of memory array or array architecture. Although floating-gate type flash memory cells in a NAND architecture are generally referred to herein, embodiments are not so limited.

In operation, data can be written to and/or read from the memory 110 as a page of data, for example. As such, a page of data can be referred to as a data transfer size of the memory system. Data can be sent to/from a host (e.g., the host 102) in data segments referred to as sectors (e.g., host sectors). As such, a sector of data can be referred to as a data transfer size of the host.

Figure 2:
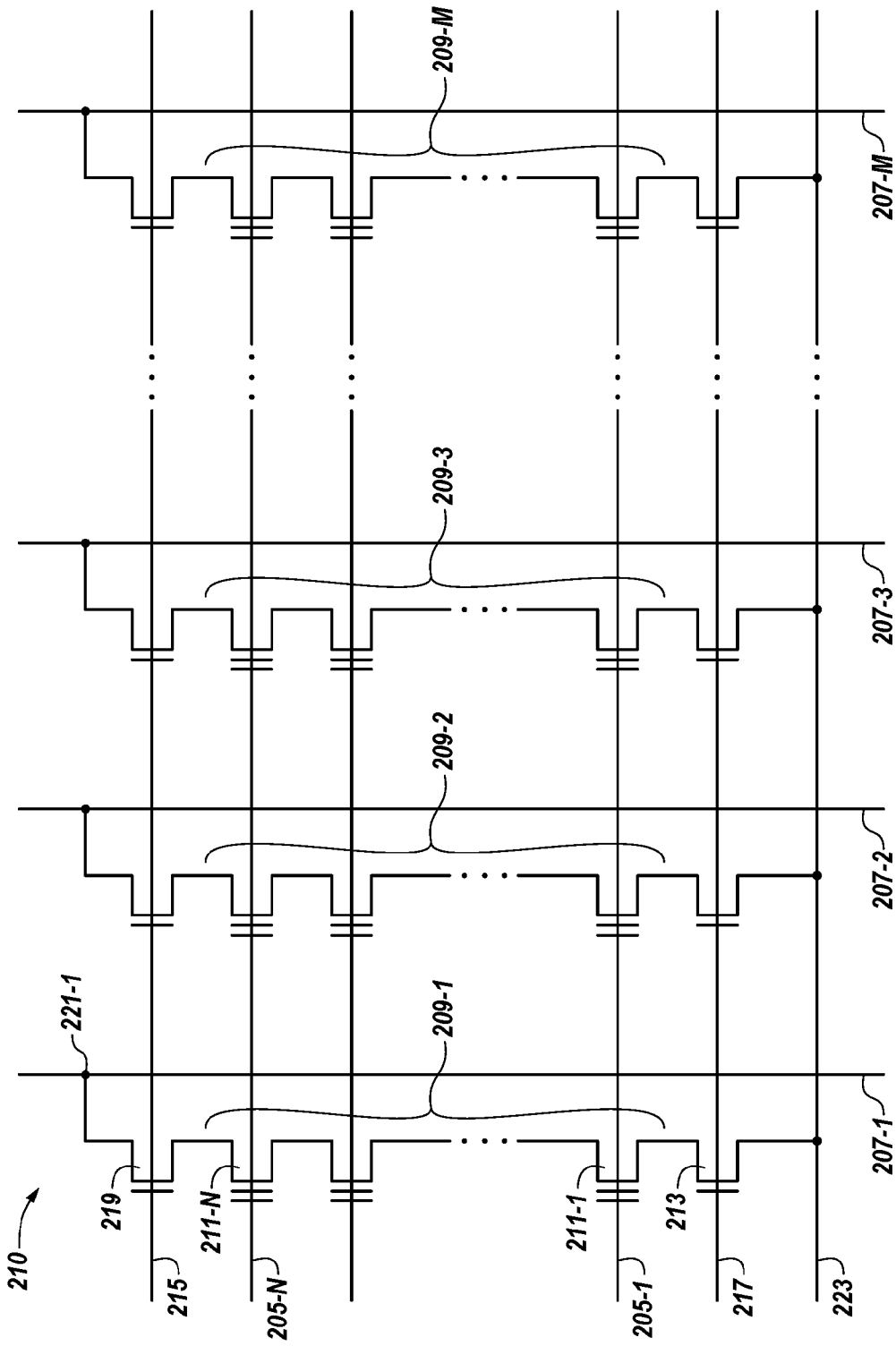
FIG. 2 is a schematic of a portion of a memory comprising an array of memory cells operable in accordance with a number of embodiments of the present disclosure.

FIG. 2 is a schematic of a portion of a memory 210 comprising an array of memory cells operable in accordance with a number of embodiments of the present disclosure. The embodiment of FIG. 2 illustrates a NAND architecture non-volatile memory array; however, embodiments described herein are not limited to this example. As shown in FIG. 2, the memory array includes access lines (e.g., word lines 205-1, . . . , 205-N) and intersecting data lines (e.g., local unit lines 207-1, 207-2, 207-3, . . . , 207-M). For ease of addressing in the digital environment, the number of word lines 205-1, . . . , 205-N and the number of local unit lines 207-1, 207-2, 207-3, . . . , 207-M can be some power of two (e.g., 256 word lines by 4,096 unit lines).

The memory array includes NAND strings 209-1, 209-2, 209-3, . . . , 209-M. Each NAND string includes non-volatile memory cells 211-1, . . . , 211-N, each communicatively coupled to a respective word line 205-1, . . . , 205-N. Each NAND string (and its constituent memory cells) is also associated with a local unit line 207-1, 207-2, 207-3, . . . , 207-M. The memory cells 211-1, . . . , 211-N of each NAND string 209-1, 209-2, 209-3, . . . , 209-M are coupled in series source to drain between a source select gate (SGS) (e.g., a field-effect transistor (FET) 213) and a drain select gate (SGD) (e.g., FET 219). Each source select gate 213 is configured to selectively couple a respective NAND string to a common source 223 responsive to a signal on source select line 217, while each drain select gate 219 is configured to selectively couple a respective NAND string to a respective unit line responsive to a signal on a drain select line 215.

As shown in the embodiment illustrated in FIG. 2, a source of source select gate 213 is coupled to a common source line 223. The drain of source select gate 213 is coupled to the source of the memory cell 211-1 of the corresponding NAND string 209-1. The drain of drain select gate 219 is coupled to unit line 207-1 of the corresponding NAND string 209-1 at drain contact 221-1. The source of drain select gate 219 is coupled to the drain of the last memory cell 211-N (e.g., a floating-gate transistor) of the corresponding NAND string 209-1.

In a number of embodiments, construction of the non-volatile memory cells 211-1, . . . , 211-N includes a source, a drain, a floating gate or other charge storage structure, and a control gate. The memory cells 211-1, . . . , 211-N have their control gates coupled to a word line, 205-1, . . . , 205-N, respectively. A NOR array architecture would be similarly laid out, except that the string of memory cells would be coupled in parallel between the select gates. Furthermore, a NOR architecture can provide for random access to the memory cells in the array (e.g., as opposed to page-based access as with a NAND architecture).

In operation, a number of cells coupled to a selected word line (e.g., the word lines 205-1, . . . , 205-N) can be written and/or read together as a group. A group of cells written and/or read together can be referred to as a page of cells (e.g., a physical page) and can store a number of pages of data (e.g., logical pages). For instance, the memory cells 211-1, . . . , 211-N can be multilevel cells configured to store more than one unit (e.g., unit) of data. In some such instances, the units stored in each multilevel cell can correspond to different logical pages of data. For example, a first unit of a 2-unit cell may correspond to a first logical page of data (e.g., a lower page), and a second unit of the 2-unit cell may correspond to a second logical page of data (e.g., an upper page). Cells storing more than two units per cell may comprise a first unit corresponding to a lower page of data, a second unit corresponding to an upper page of data, and one or more additional units corresponding to one or more middle pages of data. A number of cells coupled to a particular word line and programmed together to respective data states can be referred to as a target page. A programming operation can include applying a number of program pulses (e.g., 16V-20V) to a selected word line in order to increase the threshold voltage (Vt) of selected cells coupled to that selected word line to a desired voltage level corresponding to a targeted data state.

Read operations can include sensing a voltage and/or current change of a unit line coupled to a selected cell in order to determine the state of the selected cell. The read operation can include precharging a unit line and sensing the discharge when a selected cell begins to conduct. One type of read operation comprises applying a ramping read signal to a selected word line, and another type of read operation comprises applying a plurality of discrete read signals to the selected word line to determine the states of the cells. Embodiments can include reading a codeword from the memory array with a changed trim level and decoded with an erasure-assisted ECC decoder in accordance with present disclosure.

Figure 3A:
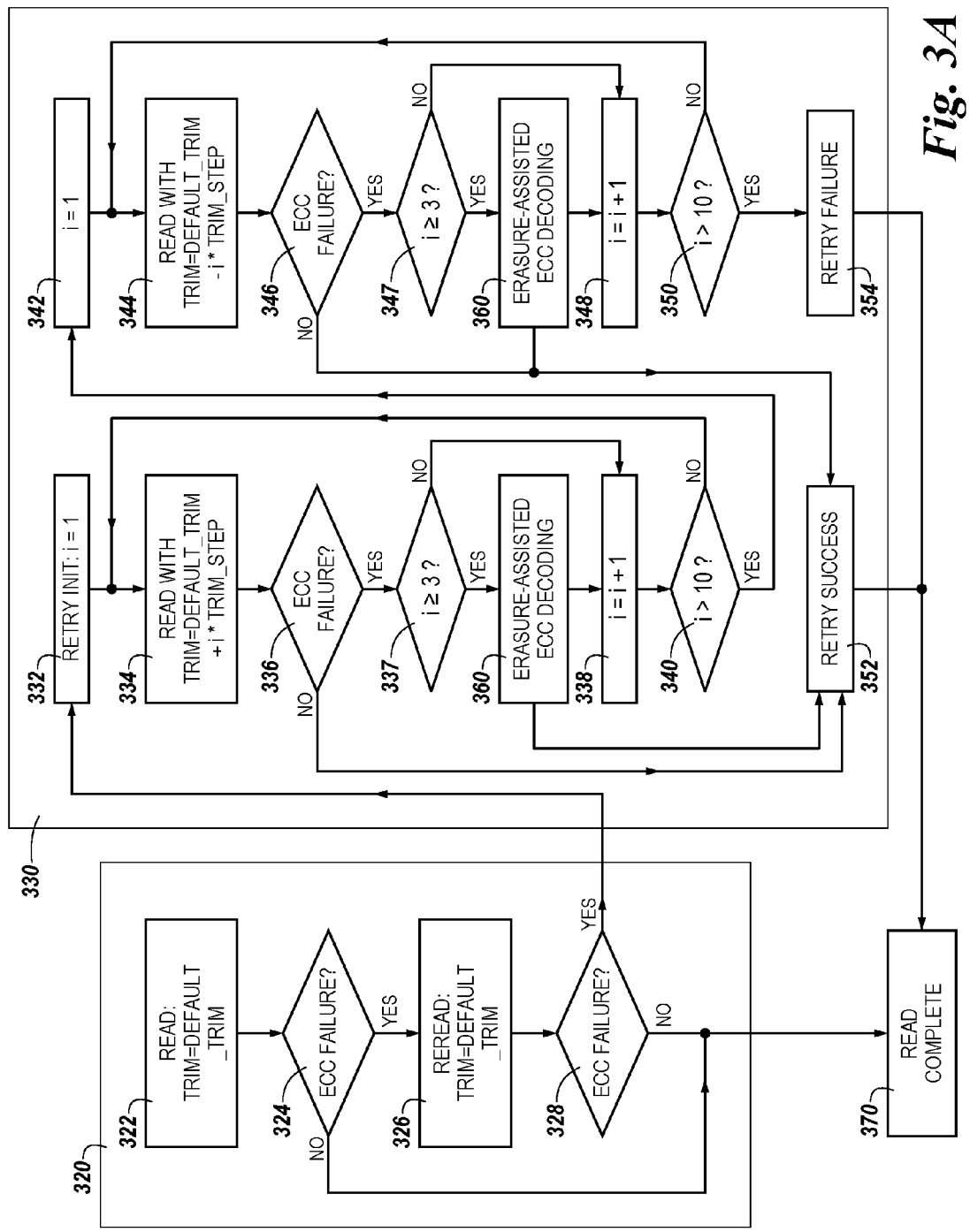
FIG. 3A is a flowchart showing an example ECC decoding process employing an erasure-assisted ECC decoding process during each retry iteration in accordance with a number of embodiments of the present disclosure.

FIG. 3A is a flowchart showing an example ECC decoding process employing an erasure-assisted ECC decoding process 360 during each retry iteration in accordance with a number of embodiments of the present disclosure. The process can begin with an example initial ECC decoding attempt 320. At step 322, a codeword is read with a default trim level. At decision box 324, the controller (e.g., the controller 108) can determine if an ECC decoding failure has occurred. As used herein, an "ECC decoding failure" is meant to refer to when there are more errors in a codeword than the ECC correction capability of an ECC decoder. If, at decision box 324, there is no ECC decoding failure, then the process can continue to step 370 indicating that the read is complete. If, at decision box 324, there is an ECC decoding failure, then the codeword can be read again with the default trim level at step 326. If, at decision box 328, there is no ECC decoding failure, then the process can continue to step 370 indicating that the read is complete. If, at decision box 328, there is an ECC decoding failure, then the process can continue to an example ECC decoding retry process 330.

At step 332, an iteration counter (e.g., "i") can be initialized at one. At step 334, the codeword can be read with a changed trim level, which can be changed during each of the retry iterations. Thus, the codeword can be read with a plurality of trim levels. The changed trim level can be incremented from a first trim level to yield a second trim level and/or incremented from the second trim level to yield a third trim level such that the second trim level is greater than the first trim level and the third trim level is greater than the second trim level. The increment can be the same or different for different trim levels. The changed trim level can be realized by adding a trim level step to a first trim level to yield a second trim level and/or by adding the trim level step to the second trim level to yield a third trim level, where the same trim level step is used in each incrementing retry iteration. As shown at step 334, the changed trim level can be a default trim level plus a trim level step multiplied by the iteration counter. For example, if the default trim level is 1.5 volts (V) and the trim level step is 0.1 V, then the first trim level would be 1.6 V and the second trim level would be 1.7 V. If, at decision box 336, there is no ECC decoding failure, then the process can continue to step 352 indicating a retry success and then to step 370 indicating that the read is complete. If, at decision box 336, there is an ECC decoding failure, then the process can continue to decision box 337 to determine if the codeword has been read with at least a particular quantity of iteratively changed trim levels (e.g., three incrementing retry iterations or i≥3). If the codeword has not been read with at least the particular quantity of iteratively changed trim levels then the process continues to step 338, bypassing the erasure-assisted ECC decoding process 360. If the codeword has been read with at least the particular quantity of iteratively changed trim levels then the process continues to the erasure-assisted ECC decoding process 360.

Figure 3B:
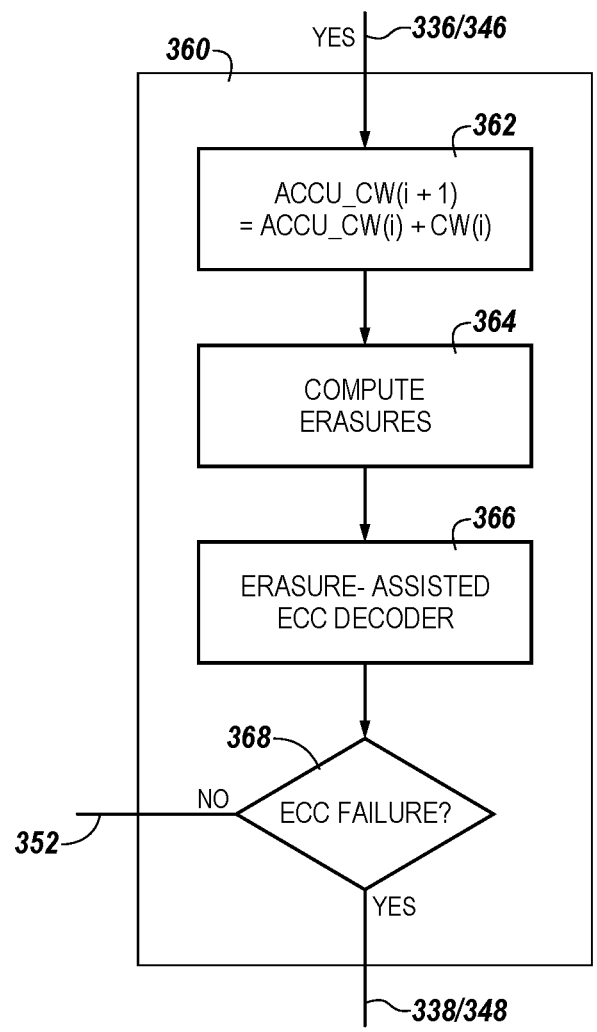
FIG. 3B is a flowchart showing steps of an erasure-assisted ECC decoding process in accordance with a number of embodiments of the present disclosure.

FIG. 3B is a flowchart showing steps of an erasure-assisted ECC decoding process 360 in accordance with a number of embodiments of the present disclosure. The erasure-assisted ECC decoding process 360 can begin at step 362, the results from reading a codeword with each of the at least a particular quantity of iteratively changed trim levels can be accumulated on a unit-by-unit basis. For example, if the particular quantity of iteratively changed trim levels is three (e.g., i≥3) and the codeword has been read with five iteratively changed trim levels (e.g., i=5) then the results from reading the codeword with the five iteratively changed trim levels will be accumulated on a unit-by-unit basis. The accumulation can be a mathematical sum operation performed on the results from reading a particular unit of a codeword (e.g., a readback unit sequence). A threshold T can be chosen to determine a detected unit of the particular unit of the codeword (e.g., a detected bit sequence). All of the detected units corresponding to the codeword can be a detected unit sequence. In a case where a unit of the codeword is a bit, the detected unit sequence can be a detected bit sequence. As an example, the criteria for a detected bit sequence can be:

$$\text{detected\_bit} = \begin{cases} 1, & \text{SUM} > T \\ 0, & \text{SUM} \leq T \end{cases}$$

If an accumulation (e.g., sum) of a readback bit sequence for a particular bit of the codeword is greater than a threshold T, then the detected bit can be "1". If an accumulation (e.g., sum) of a readback bit sequence for a particular bit of the codeword is less than or equal to a threshold T, then the detected bit can be "0".

At step 364, erasures can be calculated for the detected unit sequence. A reliability value can be calculated for each detected unit by subtracting the accumulation corresponding to a detected unit from the threshold T. The absolute value of the reliability value can be taken in the case of a negative reliability value. A lower reliability value can be indicative of a less reliable detected unit of the detected unit sequence. A detected unit with a low reliability value can be an erasure. An erasure can be calculated as any detected unit of a detected unit sequence having a reliability value less than or equal to a reliability value threshold. The number of erasures can be limited such that if more than one detected unit has a reliability value less than or equal to the reliability value threshold, then a subset of those detected units would be erasures.

At step 366, the erasure-assisted ECC decoder can modify a detected bit sequence by changing one or more detected units that correspond to one or more erasures. The detected unit sequence and the location of the erasures within the detected unit sequence can be received by the erasure-assisted ECC decoder. In a case where the detected unit sequence is a detected bit sequence, the detected bit sequence can be modified by changing the erasure. For example, if the erasure is a "1" then the erasure can be changed such that it becomes a "0" in the modified detected bit sequence.

The modified detected bit sequence can be decoded with the erasure-assisted ECC decoder. The erasure-assisted ECC decoder (e.g., the ECC component 112) can be any kind of ECC decoder. If, at decision box 368, there is no ECC decoding failure from decoding the result from reading the codeword with the changed trim level with the erasure-assisted ECC decoder at step 366, then the process can continue to step 352 indicating a retry success and then to step 370 indicating that the read is complete as illustrated in FIG. 3A. If, at decision box 368, there is an ECC decoding failure, then the process can return to the ECC decoding retry process 330 and step 338 where the iteration counter can be incremented as illustrated in FIG. 3A.

Although not shown in FIG. 3B, if there is more than one erasure and if, at decision box 468, there was an ECC decoding failure during the erasure-assisted ECC decoding, then the detected unit sequence can be modified again. For example, where the detected unit sequence is a detected bit sequence and there are N erasures, there will be $2^N$ possible bit sequences for the N erasures. If there are two erasures then there are $2^2$ (four) possible bit sequences: [0 0], [0 1], [1 0], and [1 1]. If the detected bit values of the erasures were [0 0] and a first modified detected bit sequence changed the two erasures to be [1 1] then the one of the two erasures can changed such that a second modified detected bit sequence modifies the two erasures to be either [0 1] or [1 0]. If there is an ECC decoding failure during the erasure-assisted ECC decoding of the second modified bit sequence then the detected bit sequence can be modified yet again with another possible bit sequence. The detected bit sequence can be modified until the each of the $2^N$ possible bit sequences have been used in the modified detected bit sequence before continuing to decision box 338 or 348.

Returning to the ECC decoding retry process 330, at decision box 340, if a particular quantity of iteratively changed trim levels (e.g., ten incrementing retry iterations) has not been exceeded, then the process returns to step 334 to read the codeword with the next iteratively changed trim level (e.g., another one of a plurality of trim levels), and continue with the ECC decoding process as described above. If, at decision box 340, the particular quantity of iteratively changed trim levels has been exceeded then the ECC decoding retry process 330 can switch to changing the trim level by iteratively decrementing the trim level or subtracting a trim level step.

At step 342, the iteration counter can be reset to one. At step 344, the codeword is read with a changed trim level, which can be changed during each of the retry iterations. Thus, the codeword can be read with a plurality of trim levels. The changed trim level can be decrementing a first trim level to yield a second trim level or decrementing the second trim level to yield a third trim level such that the second trim level is less than the first trim level and the third trim level is less than the second trim level. The changed trim level can be subtracting a trim level step from a first trim level to yield a second trim level or subtracting the trim level step from the second trim level to yield a third trim level, where the same trim level step is used in each decrementing retry iteration. As shown at step 344, the changed trim level can be equal to a default trim level minus a trim level step times the iteration counter. For example, if the default trim level is 1.5 V and the trim level step is 0.1 V, then the first trim level (e.g., for the first decrementing retry iteration) would be 1.4 V and a second trim level would be 1.3 V. If, at decision box 346, there is no ECC decoding failure, then the process continues to step 352 indicating a retry success and then to step 370 indicating that the read is complete. If, at decision box 346, there is an ECC decoding failure, then process can continue to decision box 347 to determine if the codeword has been read with at least a particular quantity of iteratively changed trim levels (e.g., three incrementing retry iterations or i≥3). If the codeword has not been read with at least the particular quantity of iteratively changed trim levels then the process continues to step 348, bypassing the erasure-assisted ECC decoding process 360. If the codeword has been read with at least the particular quantity of iteratively changed trim levels then the process continues to the erasure-assisted ECC decoding process 360.

The erasure-assisted ECC decoding process 360 for the decrementing retry iterations can be the same as the erasure-assisted ECC decoding process 360 for the incrementing retry iterations as discussed above. At decision box 350, after a particular quantity of iteratively changed trim levels (e.g., ten decrementing retry iterations) and the ECC decoding has failed for all of the retry iterations then the process can continue to step 354 indicating a retry failure and then continues to step 370 indicating that the read is complete.

Figure 4:
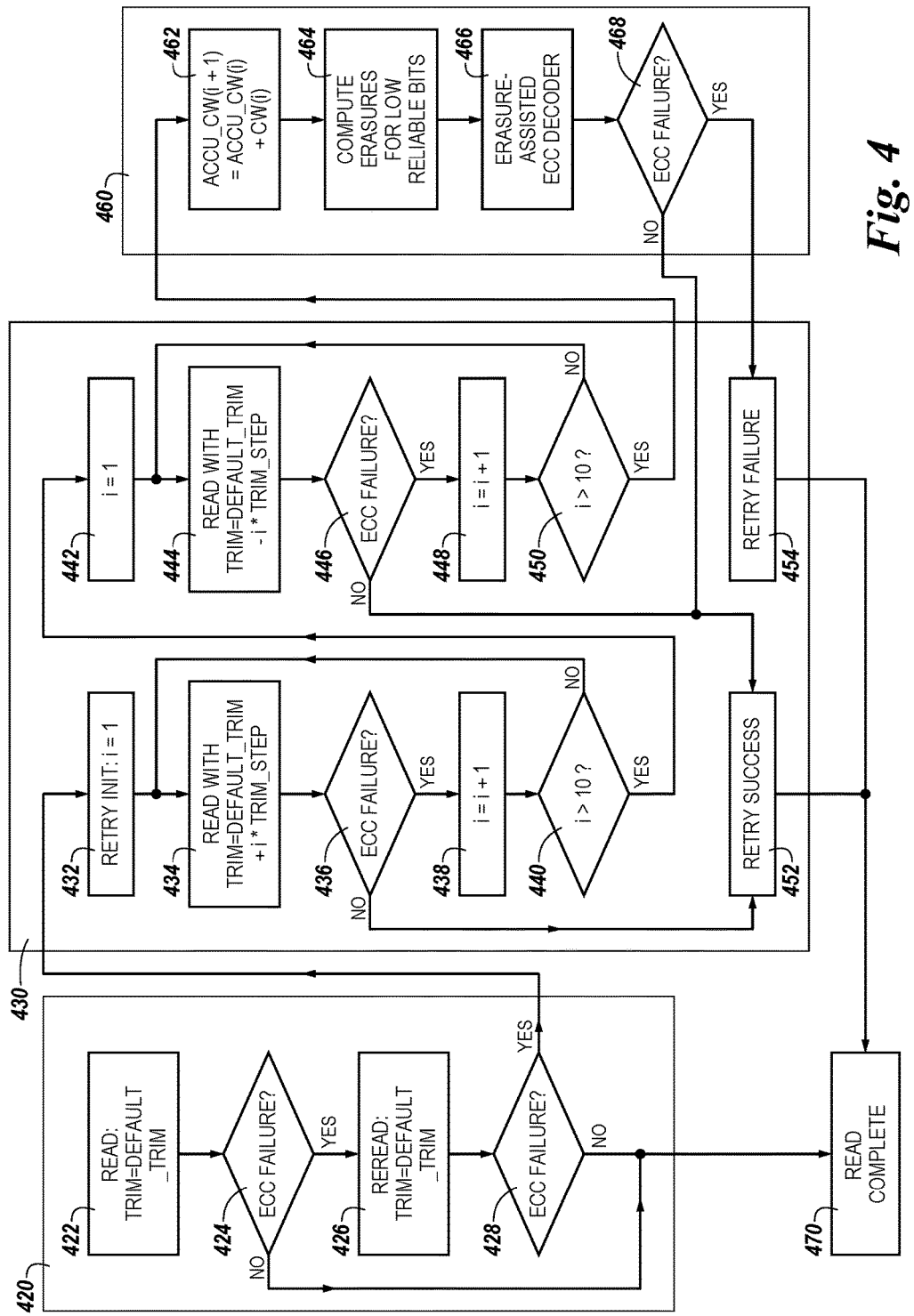
FIG. 4 is a flowchart showing an example ECC decoding process employing an erasure-assisted ECC decoding process in accordance with a number of embodiments of the present disclosure.

FIG. 4 is a flowchart showing an example ECC decoding process employing an erasure-assisted ECC decoding process 460 in accordance with a number of embodiments of the present disclosure. The process shown in FIG. 4 differs from the process shown in FIGS. 3A and 3B in that the example erasure-assisted ECC decoding process 460 is employed after the example ECC decoding retry process 430 has failed for all of the retry iterations. The example initial ECC decoding attempt 420 in FIG. 4 can be the same as the example initial ECC decoding attempt 320 in FIG. 3A, as described above.

The example ECC decoding retry process 430 in FIG. 4 can be similar to the example ECC decoding retry process 330 in FIG. 3A. At step 432, an iteration counter (e.g., "i") can be initialized at one. At step 434, the codeword can be read with a changed trim level (e.g., the default trim level used in the initial ECC decoding attempt 420 plus a trim level step times the iteration counter), which can be changed during each of the retry iterations. For example, if the default trim level is 1.5 V and the trim level step is 0.1 V, then a first trim level (e.g., for the first incrementing retry iteration) would be 1.6 V and a second trim level would be 1.7 V. If, at decision box 436, there is no ECC decoding failure, then the process can continue to step 452 indicating a retry success and then to step 470 indicating that the read is complete. If, at decision box 436, there is an ECC decoding failure, then the process can continue to step 438 where the iteration counter is incremented. At decision box 440, if a particular quantity of iteratively changed trim levels (e.g., ten incrementing retry iterations) has not been exceeded, then the process can return to step 434 to read the codeword with a second trim level, and continue with the ECC decoding retry process 430. If, at decision box 440, the particular quantity of iteratively changed trim levels has been exceeded then the ECC decoding retry process 430 can switch to changing the trim level by iteratively decrementing the trim level or subtracting a trim level step.

At step 442, the iteration counter can be reset to one. At step 444, the codeword is read with a changed trim level (e.g., a decremented trim level equal to the default trim level minus a trim level step times the iteration counter). For example, if the default trim level is 1.5 V and the trim level step is 0.1 V, then a first trim level (e.g., for the first decrementing retry iteration) would be 1.4 V and a second trim level would be 1.3 V. If, at decision box 446, there is no ECC decoding failure, then the process continues to step 452 indicating a retry success and then continues to step 470 indicating that the read is complete. If, at decision box 446, there is an ECC decoding failure, then the process can continue to step 448 where the iteration counter is incremented. At decision box 450, if a particular quantity of iteratively changed trim levels (e.g., ten decrementing retry iterations) has not been exceeded, then the process can return to step 444 to read the codeword with a second trim level, and continue with the ECC decoding retry process 430. If, at decision box 450, the particular quantity of iteratively changed trim levels has been exceeded then process can continue to the erasure-assisted ECC decoding process 460.

At step 462, the results from reading a codeword with each of a plurality of trim levels can be accumulated on a unit-by-unit basis. The accumulation can be a mathematical sum operation performed on the results from reading a particular unit of a codeword (e.g., a readback unit sequence). A threshold T can be chosen to determine a detected unit corresponding to a particular unit of the codeword. All of the detected units corresponding to the codeword can be a detected unit sequence. In a case where a unit of the codeword is a bit, the detected unit sequence can be a detected bit sequence. As an example, the criteria for a detected bit sequence can be:

$$\text{detected\_bit} = \begin{cases} 1, & \text{SUM} > T \\ 0, & \text{SUM} \leq T \end{cases}$$

If an accumulation (e.g., sum) of a readback bit sequence for a particular bit of the codeword is greater than a threshold T, then the detected bit can be a "1". If an accumulation (e.g., sum) of a readback bit sequence for a particular bit of the codeword is less than or equal to a threshold T, then the detected bit can be a "0".

At step 464, erasures can be calculated for the detected unit sequence. A reliability value can be calculated for each detected unit by subtracting the accumulation corresponding to a detected unit from the threshold T. The absolute value of the reliability value can be taken in the case of a negative reliability value. A lower reliability value can be indicative of a low reliability unit. A detected unit with a low reliability value can be an erasure. An erasure can be calculated as any detected of a detected unit sequence having a reliability value less than or equal to a reliability value threshold. The number of erasures can be limited such that if more than one detected unit has a reliability value less than or equal to the reliability value threshold, then a subset of those detected units would be erasures.

At step 466, the erasure-assisted ECC decoder can modify a detected unit sequence by changing one or more detected units that correspond to one or more erasures. The detected unit sequence and the location of the erasures within the detected unit sequence can be received by the erasure-assisted ECC decoder. In a case where the detected unit sequence is a detected bit sequence, the detected bit sequence can be modified by changing the erasure. For example, if the erasure is a "1" then the erasure can be changed such that it becomes a "0" in the modified detected bit sequence.

The modified detected unit sequence can be decoded with the erasure-assisted ECC decoder. Whether or not the ECC decoding was successful can be reported. If, at decision box 468, there was an ECC decoding failure during the erasure-assisted ECC decoding, then the process can continue to step 454 indicating a retry failure and then to step 470 indicating that the read is complete. If, at decision box 468, there was no ECC decoding failure during the erasure-assisted ECC decoding, then the process can continue to step 452 indicating a retry success and then to step 470 indicating that the read is complete.

Although not shown in FIG. 4, if there are more than one erasure, if, at decision box 468, there was an ECC decoding failure during the erasure-assisted ECC decoding, then the detected unit sequence can be modified again. For example where the detected unit sequence is a detected bit sequence and there are N erasures, there will be $2^N$ possible bit sequences for the N erasures. If there are two erasures then there are $2^2$ (four) possible bit sequences: [0 0], [0 1], [1 0], and [1 1]. If the detected bit values of the erasures were [0 0] and a first modified detected bit sequence changed the two erasures to be [1 1] then the one of the two erasures can changed such that a second modified detected bit sequence modifies the two erasures to be either [0 1] or [1 0]. If there is an ECC decoding failure during the erasure-assisted ECC decoding of the second modified bit sequence then the detected bit sequence can be modified yet again with another possible bit sequence. The detected bit sequence can be modified until the each of the $2^N$ possible bit sequences have been used in the modified detected bit sequence.

Although an example initial ECC decoding attempt 320/420 and an example ECC decoding retry process 330/430 have been shown in FIGS. 3 and 4, respectively, the erasure-assisted ECC decoding process 360/460 can be used in conjunction with any kind of initial ECC decoding attempt and any kind of ECC decoding retry process.

FIG. 5 is an example of accumulations and reliability value computations in accordance with a number of embodiments of the present disclosure. The example of FIG. 5 shows results from reading a codeword comprising seventeen bits numbered 1 through 17 with ten changed trim levels numbered 1 through 10. The results corresponding to a particular bit of the codeword can be a readback bit sequence. The readback bit sequence for each bit of the codeword can be accumulated using a mathematical sum operation. The row labeled "SUM" shows the accumulation for each bit of the codeword. As illustrated in the readback bit sequence 580 for bit 1, bit 1 was read to be a "1" with all ten trim levels such that the SUM for bit 1 381 is ten. In contrast, the readback bit sequence 584 for bit 9 shows that bit 9 was read to be a "1" with only five of the ten trim levels such that the SUM for bit 9 585 is five.

As described above, a threshold T can be chosen to determine a detected bit for each bit of the codeword. If the threshold T is five, the criteria for a detected bit can be:

$$\text{detected\_bit} = \begin{cases} 1, & \text{SUM} > 5 \\ 0, & \text{SUM} \le 5 \end{cases}$$

Because the SUM for bit 1 581 is greater than five, the detected bit 582 is "1". Because the SUM for bit 9 585 is equal to five, the detected bit 586 is "0".

As described above, a reliability value can be computed for each detected bit of a detected bit sequence. The reliability value can be computed by subtracting the threshold from the SUM corresponding to each detected bit. A positive reliability value in this example corresponds to the detected bit being a "1" whereas a negative reliability value in this example corresponds to the detected bit being a "0". The reliability value for bit 1 583 is five corresponding to a more reliable bit (bit 1 was read to be a "1" with all ten trim levels). In contrast, the reliability value for bit 9 587 is zero corresponding to a less reliable bit (bit 9 was read to be a "0" with the first six trim levels and a "0" with the last four trim levels). Because bit 9 has the lowest reliability value of zero, bit 9 could be an erasure that could be changed for erasure-assisted ECC decoding as described above. Because bit 11 has the second lowest reliability value 591 of one, bit 11 could also be an erasure that could be changed for erasure-assisted ECC decoding as described above.

Although the example in FIG. 5 shows a codeword that is seventeen bits long, embodiments are not so limited. Similarly, embodiments are not limited to ten trim levels or a threshold of five.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
reading, by a controller, a codeword from an array of memory cells with a first voltage;
performing, by the controller, an error correction code (ECC) decoding retry process responsive to an ECC decoding failure resulting from reading the codeword with the first voltage, the ECC decoding retry process comprising:
reading the codeword from the array with a second voltage to yield a first result;
changing the second voltage to yield a third voltage in response to the second voltage resulting in an ECC decoding failure;
reading the codeword from the array with third voltage to yield a second result;
changing the third voltage to yield a fourth voltage in response to the third voltage resulting in an ECC decoding failure;
reading the codeword from the array with fourth voltage to yield a third result; and
in response to the fourth voltage resulting in an ECC decoding failure:
accumulating the first result, the second result, and the third result for each unit of the codeword;
computing a detected unit sequence, wherein each detected unit of the detected unit sequence corresponds to each unit of the codeword;
computing an erasure of the detected unit sequence;
modifying the detected unit sequence by changing the erasure, wherein the erasure is a particular detected unit in a position of the detected unit sequence corresponding to the erasure; and
ECC decoding the modified detected unit sequence.

2. The method of claim 1, wherein accumulating the first result, the second result, and the third result comprises performing a mathematical sum operation on units of the first result, the second result, and the third result corresponding to each unit of the codeword.

3. The method of claim 1, wherein computing the detected unit sequence comprises determining a detected unit corresponding to each unit of the codeword,
wherein the detected unit is a first value if the accumulation for each unit of the codeword is greater than a threshold and the detected unit is a second value if the accumulation for each unit of the codeword is less than or equal to the threshold.

4. The method of claim 1, wherein computing the erasure comprises computing a reliability value for each detected unit of the detected unit sequence.

5. The method of claim 4, wherein computing a reliability value for each detected unit of the detected unit sequence comprises subtracting the accumulation for each unit of the codeword from a threshold.

6. The method of claim 5, wherein computing the erasure comprises:
determining a lowest reliability value of the detected unit sequence, wherein the lowest value corresponds to the erasure; and
locating the position of the erasure within the detected unit sequence.

7. The method of claim 1, wherein changing the second voltage comprises incrementing the second voltage to yield the third voltage or adding a voltage step to the second voltage to yield the third voltage.

8. The method of claim 1, wherein changing the third voltage comprises incrementing the third voltage to yield the fourth voltage or adding the voltage step to the third voltage to yield the fourth voltage.

9. The method of claim 1, wherein changing the second voltage comprises decrementing the second voltage to yield the third voltage or subtracting a voltage step from the second voltage to yield the third voltage.

10. The method of claim 1, wherein changing the third voltage comprises decrementing the third voltage to yield the fourth voltage or subtracting the voltage step from the third voltage to yield the fourth voltage.

11. A method, comprising:
reading, by a controller, a codeword from an array of memory cells with a read voltage;
performing, by the controller, an error correction code (ECC) decoding retry process responsive to an ECC decoding failure resulting from reading the codeword with the read voltage, the ECC decoding retry process comprising:
iteratively reading the codeword from the array and iteratively correcting the iteratively read codeword, wherein each iteration includes:
changing a level of the read voltage;
reading the codeword from the array with the changed level of the read voltage in response to an ECC decoding failure or an erasure-assisted ECC decoding failure for a read of the codeword from the array with a previously changed level of the read voltage;
determining if the codeword has been read with at least a particular quantity of changed levels of the read voltage; and
responsive to each of at least the particular quantity of changed levels of the read voltage resulting in an ECC decoding failure or an erasure-assisted ECC decoding failure:
accumulating a readback unit sequence in response to reading the codeword with at least the particular quantity of changed levels of the read voltage; and
performing erasure-assisted ECC decoding in response to accumulating the readback unit sequence, comprising:
computing an erasure in a detected unit sequence;
locating a position of a detected unit within the detected unit sequence corresponding to the erasure;
changing the detected unit sequence by changing the detected unit; and
ECC decoding the detected unit sequence having the detected unit changed.

12. The method of claim 11, wherein computing the erasure further comprises determining whether a reliability value of each detected unit of the detected unit sequence is less than an reliability value threshold.

13. The method of claim 11, wherein iteratively reading the codeword and iteratively correcting the read codeword comprises iteratively reading the codeword and iteratively correcting the read codeword up to a particular quantity of iterations in response to successive ECC decoding failures.

14. The method of claim 11, wherein performing the erasure-assisted ECC decoding further comprises:
computing an additional erasure in the detected unit sequence;

locating an additional position of an additional detected unit within the detected unit sequence corresponding to an additional erasure;

changing the additional detected unit; and wherein ECC decoding the detected unit sequence comprises ECC decoding the detected unit sequence having the detected unit and the additional detected unit changed.

15. The method of claim 14, further comprising changing the detected unit and the additional detected unit again in response to an ECC decoding failure from ECC decoding the detected unit sequence having the detected unit and the additional detected unit changed, wherein changing the detected unit and the additional detected unit again comprises replacing the detected unit and the additional detected unit with one of a plurality of possible unit sequences.

16. The method of claim 15, wherein changing the unit and changing the additional units comprises changing a quantity of units less than or equal to a changed unit limit.

17. An apparatus, comprising:

an array of memory cells;

a controller coupled to the array, the controller configured to:

read a codeword from the array of memory cells with a read voltage;

perform an error correction code (ECC) decoding retry process responsive to an ECC decoding failure resulting from reading the codeword with the read voltage, wherein the controller being configured to perform the ECC decoding retry process comprises the controller being configured to:

read the codeword from the array with a plurality of additional voltages, wherein an additional voltage for a particular iteration is at least partially based on a number of iterations performed prior to the particular iteration; and responsive to each additional voltage of the plurality of additional voltages resulting in an ECC decoding failure:

determine, on a unit-by-unit basis, results from reading the codeword with the plurality of additional voltages to yield a detected unit sequence;

compute an erasure of the detected unit sequence; and change the erasure to modify the detected unit sequence; and an error correction code (ECC) decoder coupled to the controller, and configured to ECC decode the modified detected unit sequence.

18. The apparatus of claim 17, wherein the controller is further configured to modify the detected unit sequence by being configured to change a unit of the detected unit sequence in response to the determination yielding a difference between the results from reading the codeword with the plurality of additional voltages.

19. The apparatus of claim 17, wherein the controller is configured to modify the detected unit sequence only after reading the codeword with a particular quantity of the plurality of additional voltages.

20. The apparatus of claim 17, wherein the controller is further configured to:

determine whether the ECC decoding of the codeword of the modified detected unit sequence from reading the codeword with the plurality of trim levels has failed; and in response to the failure, declaring a retry failure.

21. The apparatus of claim 17, wherein each of the plurality of additional voltages is used to read the codeword in response to an ECC decoding failure.

* * * * *